(12) United States Patent
Park et al.

(10) Patent No.: US 6,323,517 B1
(45) Date of Patent: Nov. 27, 2001

(54) NON-VOLATILE MEMORY DEVICE WITH SINGLE-LAYERED OVERWRITING TRANSISTOR

(75) Inventors: Weon-Ho Park; Jeong-Uk Han, both of Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/522,945

(22) Filed: Mar. 10, 2000

(30) Foreign Application Priority Data

Jul. 13, 1999 (KR) .................................................. 99-28217

(51) Int. Cl.$^7$ ................................................. H01L 29/792
(52) U.S. Cl. .......................... 257/326; 257/316; 257/314; 438/258; 438/264; 438/266
(58) Field of Search ..................... 257/314–316, 257/319, 320, 321, 324, 326; 438/201, 211, 258, 257, 264, 266

(56) References Cited

U.S. PATENT DOCUMENTS

| | | | |
|---|---|---|---|
| 4,701,776 | * 10/1987 | Perlegos et al. | 357/23.5 |
| 4,980,732 | * 12/1990 | Okazawa | 357/23.5 |
| 5,267,195 | * 11/1993 | Kodama | 365/185 |
| 5,475,251 | * 12/1995 | Kuo et al. | 287/316 |
| 5,674,768 | * 10/1997 | Chang et al. | 437/43 |
| 5,703,388 | * 12/1997 | Wang et al. | 257/315 |
| 5,859,453 | * 1/1999 | Ahn | 257/314 |
| 5,973,357 | * 10/1999 | Uenoyama et al. | 257/321 |
| 6,229,176 | * 5/2001 | Hsieh et al. | 257/316 |
| 6,259,131 | * 7/2001 | Sung et al. | 257/315 |

* cited by examiner

Primary Examiner—Steven Loke
Assistant Examiner—Douglas W. Owens
(74) Attorney, Agent, or Firm—Law Offices of Eugene M. Lee, PLLC

(57) ABSTRACT

A non-volatile memory device that can prevent a functional failure in the programming process of a cell from occurring in an overwriting process, by stopping a current path from being formed through the sources of a previously programmed cell and that of a currently selected cell which is to be programmed. The present device includes a modified structure for a memory cell of an EEPROM device. The present device includes an additional overwrite transistor to separate a sense transistor from a source in the region of an active area which is expanded toward the source of the sense transistor. The overwriting transistor includes a gate formed in a single layered structure of a second conductivity layer, integrally connected with the second conductivity layer of the sense transistor. Further, a second gate insulating layer is formed between the source and the sense transistor on the substrate. Accordingly, an electric path is prevented from forming through sources of the previously programmed cell and that of the selected cell to be programmed and, in turn, to prevent the overwriting process from having any programming failure.

12 Claims, 7 Drawing Sheets

NON-VOLATILE MEMORY DEVICE WITH SINGLE-LAYERED OVERWRITING TRANSISTOR

BACKGROUND OF THE INVENTION

1. Field of the Invention

The present invention relates to a non-volatile memory device and, more particularly, to a non-volatile memory device which can prevent a program failure from occurring in an overwriting process of an electrically erasable programmable read only memory (EEPROM).

2. Brief Description of the Background Art

Different from SRAM or DRAM, an electrically erasable programmable read only memory (EEPROM) cell is a non-volatile memory cell useful for electrically erasing, storing and maintaining data without a power supply. Recently, EEPROM cells have been utilized in a variety of applications.

An EEPROM cell is classified as either a flash type memory device comprising a single cell with one transistor or a floating gate tunnel oxide type (FLOTOX) device comprising a single cell with two transistors. The former type of cell, constructed with one transistor, has an advantage in that a unit cell has a small size. The disadvantage of the one transistor cell is that it exhibits low product reliability when compared with the two transistor cell, i.e., the FLOTOX type of cell.

The FLOTOX type EEPROM memory cell has been used in smart card IC products world wide. FIGS. 1 and 2 illustrate a structure of the FLOTOX type cell. FIG. 1 is a layout diagram illustrating the structure of a memory cell of an EEPROM device. FIG. 2 is a cross-sectional view illustrating the structure along line X–X' in FIG. 1.

According to FIGS. 1 and 2, a conventional FLOTOX type EEPROM cell comprises a gate insulating layer 12 formed at an active area A of a p-type semiconductor substrate 10 to partially expose the surface of a substrate for a tunnel oxide layer 16. The tunnel oxide layer 16 is thinner than the gate insulating layer 12 which is formed at the partially exposed surface of the substrate 10 of the active area. A sense transistor I is constructed via a deposition method. The sense transistor I comprises a first conductivity layer 18, an interlevel insulating layer 20, and a second conductivity layer 22. It is positioned near the neighboring gate insulating layer 12 and the tunnel oxide layer 16. A select transistor II includes a gate having a second conductivity layer 22a positioned near the gate insulating layer 12 beside the sense transistor I. A n-type junction 14 is constructed inside the substrate 10 under the tunnel oxide layer 16 to overlap with a predetermined portion of the select transistor II. A source 24, made using a n−/n+ double junction structure, is inside the substrate 10 and is positioned at a predetermined distance from one side of the junction 14 for to overlap with a predetermined portion of the sense transistor I. A drain 26, made using a n−/n+ double junction structure, is inside the substrate 10 and is positioned at a predetermined distance from the other side of the junction 14 for to overlap with a predetermined portion of the select transistor II.

The junction 14 comprises a first n-type junction 14a of medium density positioned inside the substrate 10 below the oxide layer 16. The junction 14 further comprises a second n-type junction 14b of low density in contact with the first junction 14a and partially overlapping with the select transistor II. The first conductivity layer 18 is used as a floating gate. The second conductivity layer 22 is used as a control gate. Also, the second conductivity layer 22a is used as a select gate.

Referring again to FIGS. 1 and 2, symbols A and C represent the active area of the substrate 10 and a bit line contact forming zone, respectively.

The erasing and programming method of the EEPROM cell is described below.

The method of erasing the EEPROM cell will now be described. First a high voltage (Vpp=15V through 20V) is applied to the control gate (the second conductivity layer 22), which is used as a sense line. Then a 0V potential is applied to the bit line (drain 26). While the source 24, being used as a common ground line, is kept floating (or 0V), a high voltage (Vpp=15V through 20V) is applied to the select gate (the second conductivity layer 22a), being used as a word line, thereby creating a strong electric field which is applied to the control gate and the bit line. As a result, the blocking wall of the tunnel oxide layer 16 gets thinner, which in turn enables some of the electrons, supplied from the bit line in the FN tunnel method as they pass through the oxide layer 16, to charge into the floating gate (the first conductivity layer 18).

Likewise, if electrons fill inside the floating gate, the threshold voltage Vth of the sense transistor rises higher by 3 to 7V or so because of stored electrons. If a supply voltage is applied to the select gate, the control gate and the bit line, in order to read the cell, the higher threshold voltage Vth results in a failure to form a channel in order to stop the current from flowing. Consequently, a first state, the "off state", of the cell is memorized.

The programming process of the EEPROM cell will now be described. First a threshold voltage Vth is applied to the control gate (the second conductivity layer 22), which is being used as the sense line. Then a high voltage (Vpp=15V through 20V) is applied to the bit line (drain 26). While the source 24, used as the common grounding line, is kept floating, a high voltage (Vpp =15 through 20V) is applied to the select gate (the second conductivity layer 22a), which is used as a word line, thereby creating a strong electric field which is applied to both ends of the tunnel oxide layer 16, between the floating gate (the first conductivity layer indicated by reference numeral 18) and the substrate 10. As a result, the blocking wall of the tunnel oxide layer 16 gets thinner and thereby enables the electrons stored in the floating gate to migrate through the blocking wall of the thinner oxide layer 16, via the FN tunnel method, at one time and are discharged out to the drain 26. As electrons migrate from the floating gate, the Vth of the sense transistor is lowered by a range of −4V to −1V, or so. If a supply voltage is applied to the select gate, which is being used as a word line to read the cell, the low threshold voltage Vth causes a channel to form in order to allow current flow. Consequently, a second state, the "on state", of the cell is memorized.

The erasing process, relevant to an electron charging process, is simultaneously performed by a unit of 1 byte (8 bits) or 1 page (32 through 64 bits). The programming process, relevant to the electron discharging process, is performed in a method to discharge the electrons in a selected cell.

For a better understanding of the prior art, reference is made to FIG. 3. FIG. 3 shows a circuit diagram of memory cells for an EEPROM device. The EEPROM device includes a unit cell which was fabricated in accordance with the structure of FIG. 2. In the circuit diagram, reference symbols S and D, respectively, indicate a source being used as a grounding line and a drain being connected with the bit line. The word line, the sense line and the bit line are respectively designated by symbols W/L (W/L1, W/L2 . . . ), S/L (S/L1, S/L2 . . . ) and B/L (B/L1, B/L2 . . . ).

However, in accordance to the prior art, an EEPROM device having a memory cell being constructed in the above manner will have problems in the overwriting process. That is, problems in the process of performing another programming process to erased the "off state" of a cell and to memorize another data input after a programming process is performed. If an erased "off state" of the cell 5 is programmed again with a programmed "on state" of cell 1 being kept at the same word line (W/L1), a high voltage (Vpp=15V to 20V) is applied to the B/L5 and W/L1 of the selected cell 5 and a 0V should be applied to the S/L1 and B/L (B/L1, B/L2, B/L3, B/L4, B/L 6) of the unselected cells. In this case a current path is formed through source (S) and cell 1, which become the common grounding line, thereby cause a programming failure of the programming process for cell 5.

In order to prevent the above functional programming failure of cell 5, the memory cells are erased by a unit of 1 byte (8 bits) or 1 page (32 through 64 byte), and only a selected cell should be programmed. However, if the overwriting process is performed in this programming method, there may be operational failures in the EEPROM device as it is now operating in a mode different from the programming process desired by a programmer.

Therefore, the aforementioned programming method of the EEPROM device can not be used effectively.

SUMMARY OF THE INVENTION

It is a feature of the present invention to provide a non-volatile memory device which can prevent a functional failure in the programming process of a cell from occurring in an overwriting process, by stopping a current path from being formed through the sources of a previously programmed cell and that of a currently selected cell which is to be programmed. The present device is constructed in a modified structure for a memory cell of an EEPROM device. The present device includes an additional overwrite transistor to separate a sense transistor from a source in the region of an active area which is expanded toward the source of the sense transistor.

In order to accomplish the aforementioned feature, there is provided a non-volatile memory device comprising:

a junction formed at a predetermined position inside a substrate of the memory device;

a source formed inside the substrate and positioned at a predetermined distance from a side of the junction;

a drain formed inside the substrate and positioned at a predetermined distance from the another of the junction;

a sense transistor having a gate formed in a deposition structure and positioned at a predetermined location on the substrate to partially overlap with the junction, the deposition structure having a first conductivity layer, an interlevel insulating layer and a second conductivity layer, the sense transistor including a first gate insulating layer formed with a tunnel oxide layer between the source and the drain;

a select transistor having a gate formed in a single layered structure of a second conductivity layer, the select transistor including a second gate insulating layer formed between the junction and the drain on the substrate and positioned at a predetermined distance from the sense transistor; and an overwriting transistor having a gate formed in a single layered structure of a second conductivity layer and being integrally connected with the second conductivity layer of the sense transistor, the overwriting transistor including a second gate insulating layer formed between the source and the sense transistor.

The interlevel insulating layer, which makes up the sense transistor, can be constructed in a singe layered structure of an oxide layer or a multi-layered structure of oxide, nitride and oxide (ONO) layers, and the second conductivity layer is made up of polysilicon or polycide.

When the non-volatile memory device is fabricated in accordance with the above mentioned structure, the bit line of a selected cell, which is to be newly programmed by using the overwriting transistor, and the source of a previously programmed cell are electrically separated. Therefore, high voltage, when applied to the bit line of the selected cell, can be totally used for discharging electrons out of the floating gate in the overwriting process, thereby preventing any programming failure.

DETAILED DESCRIPTION OF THE PRESENT INVENTION

Applicants' Korean Patent Application No. 99-28217, filed Jul. 13, 1999 is incorporated herein by reference as if fully set forth herein.

Hereinafter, a preferred embodiment of the present invention will be described in detail with reference to the accompanying drawings.

Figure 1:
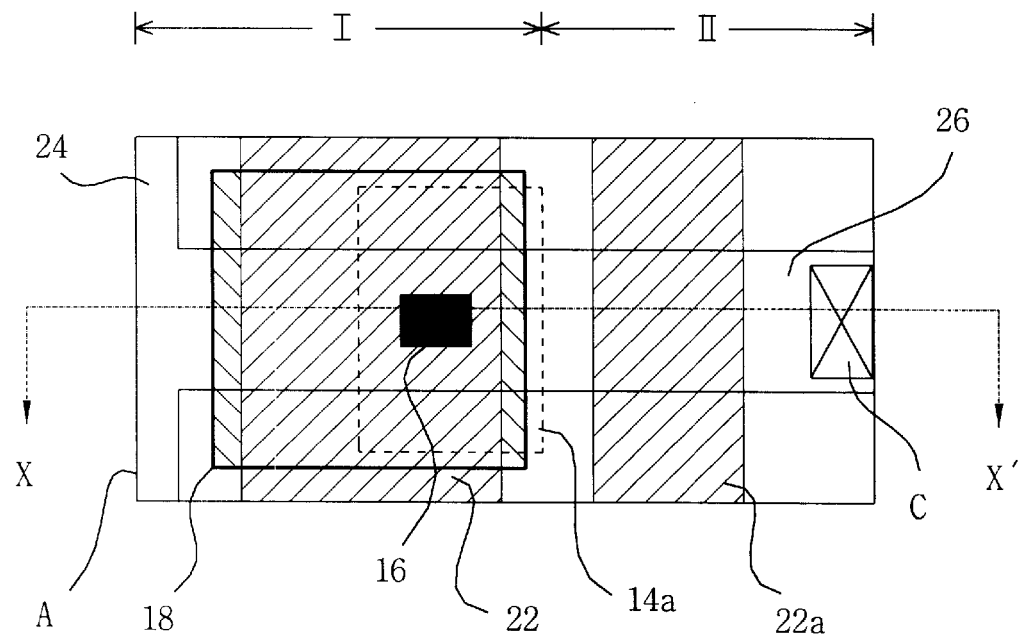
FIG. 1 is a layout diagram illustrating the structure of a memory cell of a conventional EEPROM device.
Figure 2:
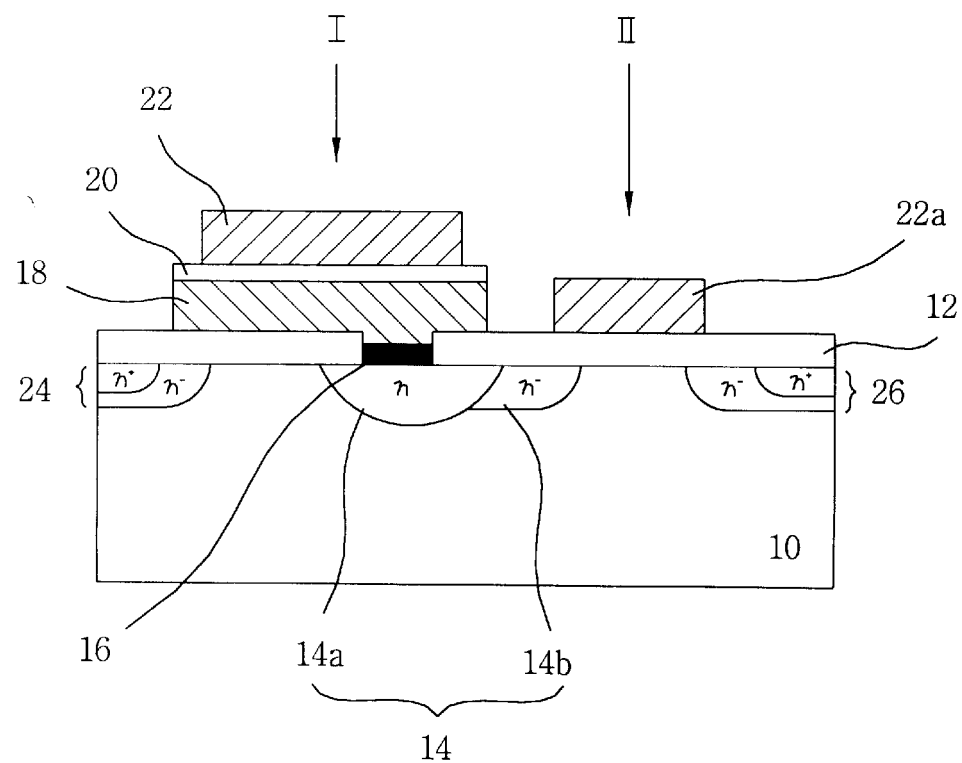
FIG. 2 is a cross-sectional view illustrating the structure cut along line X–X' shown in FIG. 1.
Figure 3:
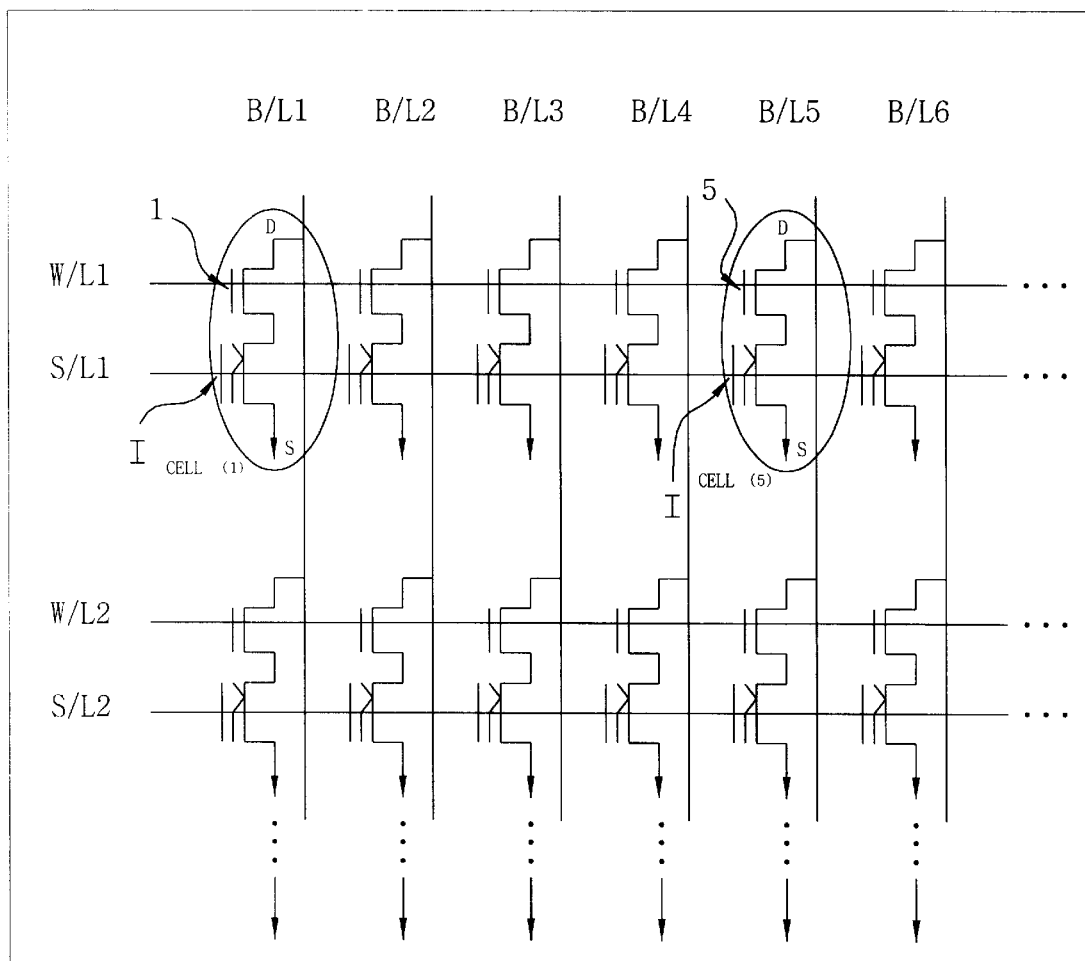
FIG. 3 is a circuit diagram illustrating the memory cell arrays of a conventional EEPROM device fabricated in accordance with the structure shown in FIG. 2.
Figure 4:
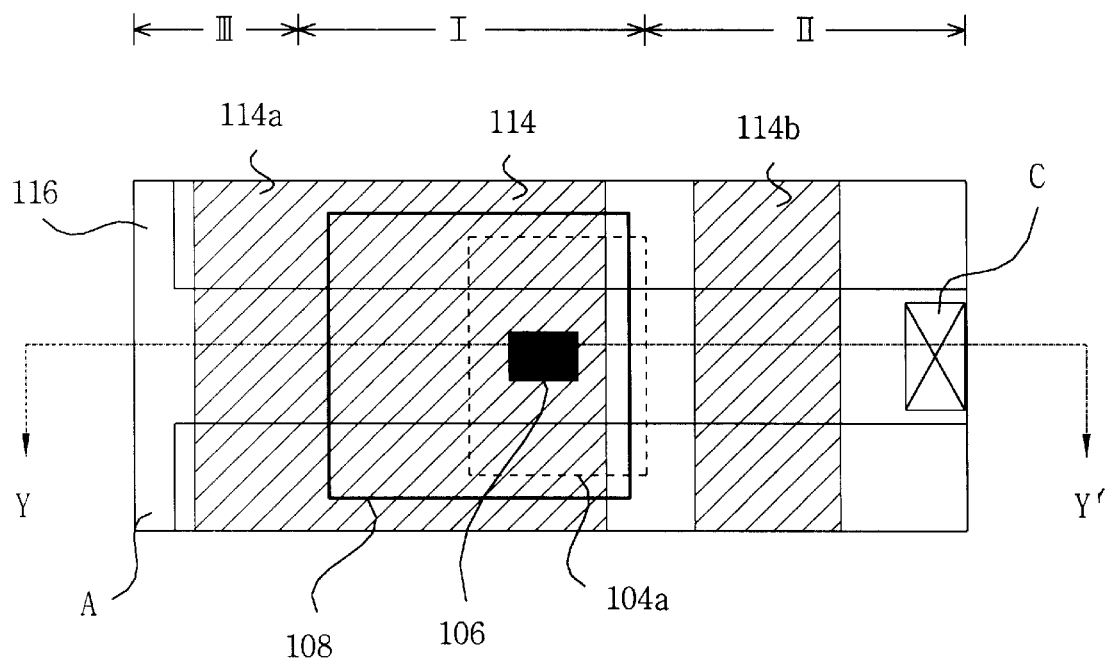
FIG. 4 is a layout diagram illustrating the structure of a memory cell of an EEPROM device in accordance with an embodiment of the present invention.
Figure 5:
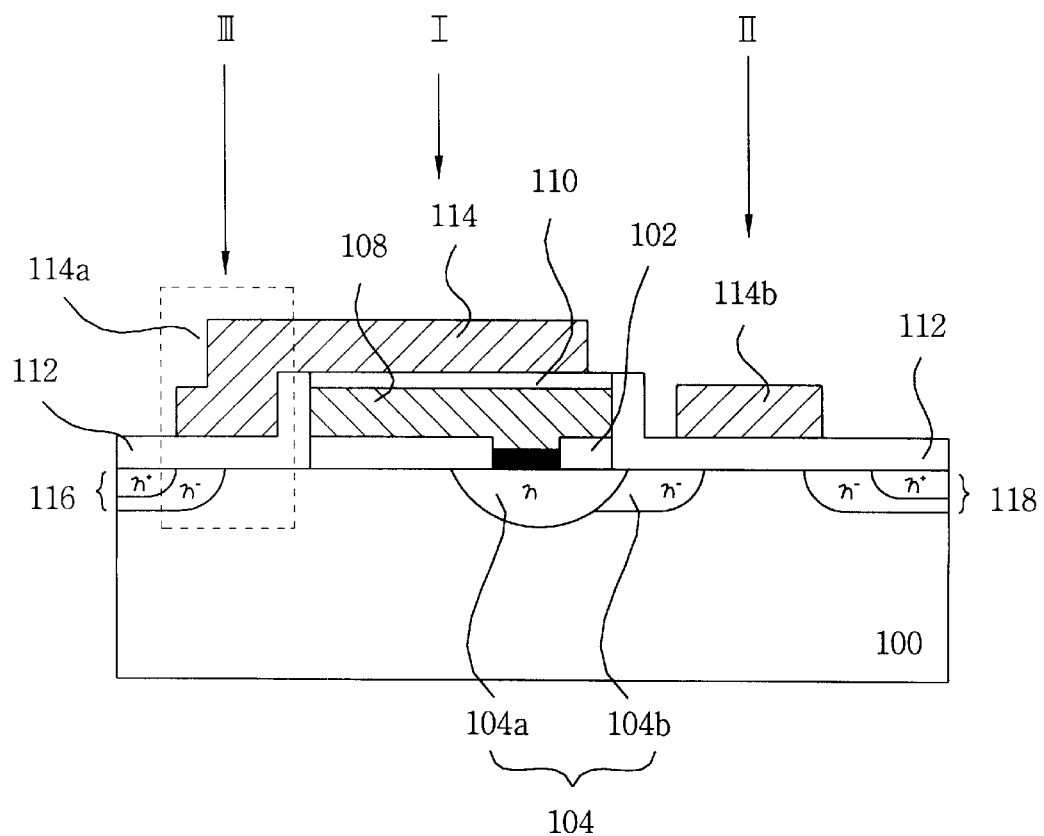
FIG. 5 is a cross-sectional view cut along line Y–Y' shown in FIG. 4.

Referring to FIGS. 4 and 5, a FLOTOX type EEPROM device comprises a n-type junction 104 formed at a predetermined position inside a p-type substrate 100. A source 116, constructed in an n−/n+ double junction structure inside the substrate 100, is at a predetermined distance from one side of the junction 104. A drain 118, constructed in an n−/n+ double junction structure inside the substrate 100, is at a predetermined distance from the other side of the junction 104. A sense transistor I includes a gate formed in a deposition structure of a first conductivity layer 108, an interlevel insulating layer 110 and a second conductivity layer 114, and partially overlaps the junction 104. The sense transistor I also includes a first gate insulating layer 102 and a tunnel oxide layer 106 between the source 116 and the drain 118 of the substrate 100.

A select transistor II includes a gate formed in a single layered structure of a second conductivity layer 114b and partially overlaps portions of the junction 104 and the drain 118, including a second gate insulating layer 112 constructed between the junction of one side of the sense transistor I and the drain in the substrate.

An overwriting transistor III includes a gate formed in a single layered structure of the second conductivity layer 114a. The second conductivity layer 114a is constructed between the source 116 and sense transistor I on the substrate 100, wherein the active area has been expanded. The second conductivity layer 114a, which is part of the overwriting transistor III, is constructed so that the second gate insulating layer 112 insulates it from the first conductivity layer 108, which is part of the sense transistor I. However, the second conductivity layer 114a is integrally connected with the second conductivity layer 114. The junction 104 comprises a n-type first junction 104a of medium density and a n-type second junction 104b of low density.

The first and second conductivity layers (108, 114), which are part of the sense transistor I, are used as a floating gate and a control gate. The second conductivity layer 114b, which is part of the select transistor II, is used as a select gate. The second conductivity layer 114a, which is part of the overwriting transistor III, is used as an overwriting gate. The first conductivity layer 108 can be made from polysilicon. The second conductivity layers 114, 114a, 114b can be made from polysilicon or polycide (polysilicon with silicide). The first conductivity layer 108, used as the floating gate, should be designed to completely separate the cells. As shown in FIG. 4, reference symbols A and C, respectively, designate the active area and the bit line contact forming zones on the substrate 100.

The EEPROM device, as shown and described with reference to FIGS. 4 and 5, can be fabricated in the operational sequence of the processes shown in FIGS. 6A through 6E.

Figure 6A:
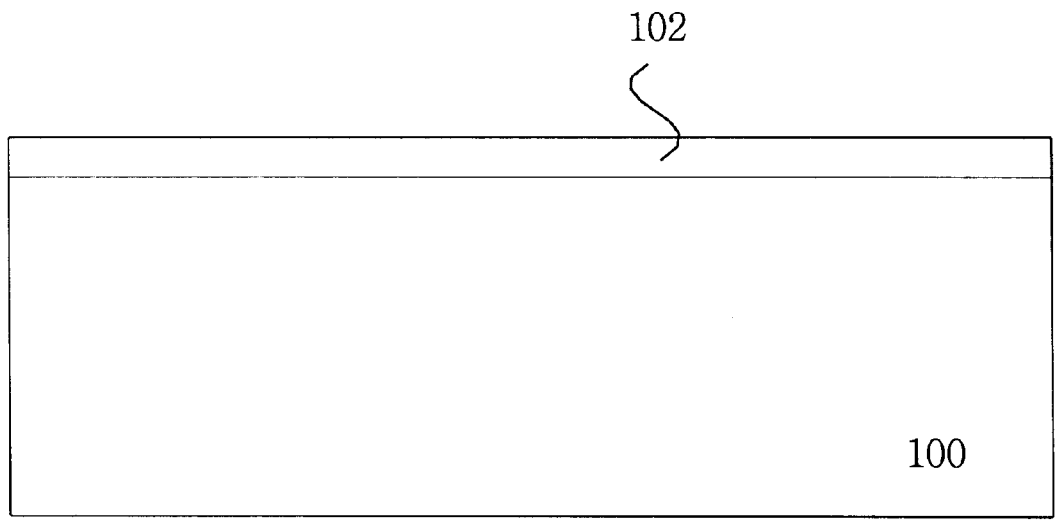
FIGS. 6A through 6E are cross-sectional views of an EEPROM device illustrating the sequential process of fabricating an EEPROM device in accordance with an embodiment of the present invention.

Referring to FIG. 6A, a field oxide layer (not shown) is formed in a device isolating region of the p type semiconductor substrate 100, which is separate from the active area. Then, the first gate insulating layer 102, an oxide layer, is formed at the active area of the substrate 100.

Figure 6B:
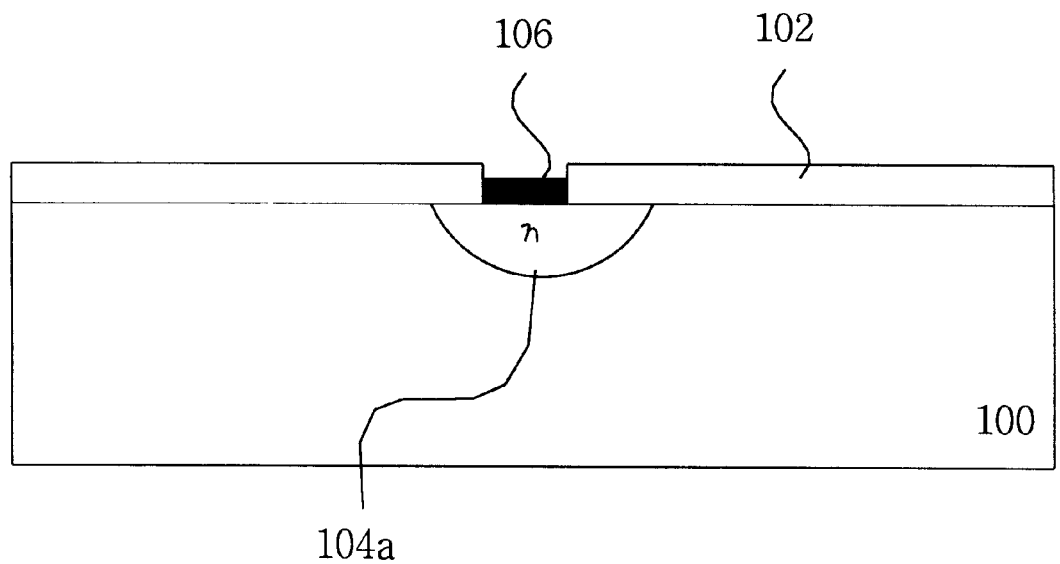

As shown in FIG. 6B, a n-type impurity of medium density is selectively ion-implanted to a select region of the substrate 100, in order to form a conductivity region in a portion of the substrate 100 where a tunnel oxide layer 106 is to be formed, thereby forming part of the first junction 104a. The first junction 104a is formed over a zone that includes the tunnel oxide layer forming zone 106 and its neighboring area. Next, in order to expose a predetermined portion of the surface of the first junction 104a, a wet etching process is performed on the first gate insulating layer 102, thereby forming an area for the tunnel oxide layer 106. The tunnel oxide layer 106, which is thinner than the first gate insulating layer 102, is selectively formed at the only portion where the gate insulating layer 102 has been removed. As a result, the tunnel oxide layer 106 is constructed in the resultant structure and is surrounded by the gate insulating layer 102.

Figure 6C:
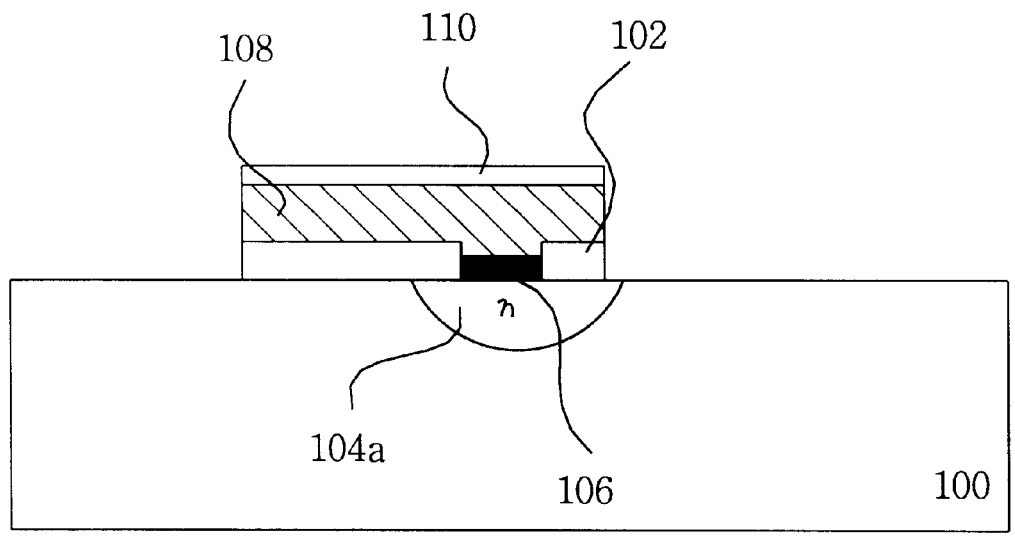
Figure 6D:
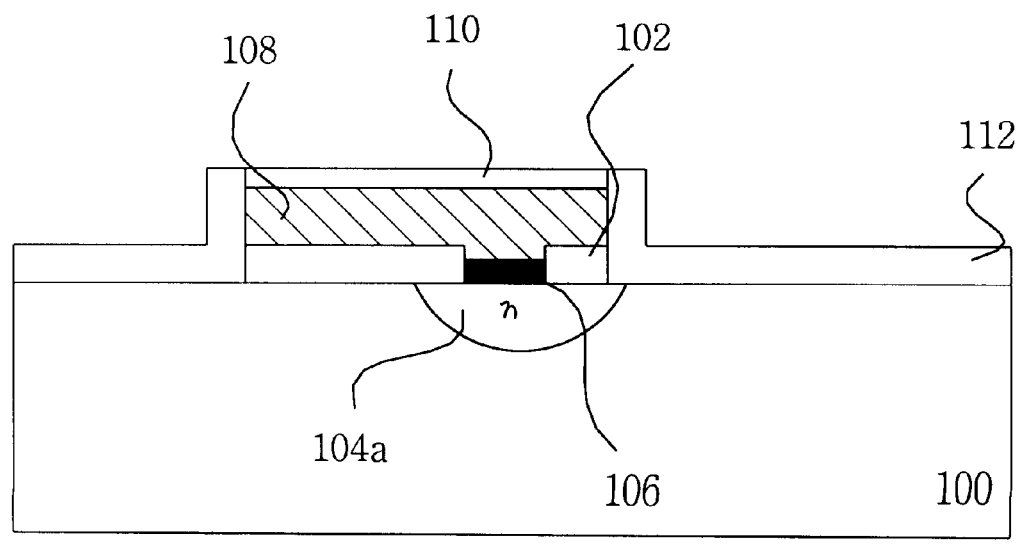

A third step, as shown in FIG. 6C, involves sequentially forming the first conductivity layer 108 and the interlevel insulating layer 110, of polysilicon, on the resultant structure of FIG. 6B. The interlevel insulating layer 110, the first conductivity layer 108 and the gate insulating layer 102 are selectively etched to expose a predetermined portion on the surface of the substrate 100. It is noted that the first conductivity layer 108 was constructed with the first gate insulating layer 102 so as to have the tunnel oxide layer 106 positioned at the bottom thereof. With the interlevel insulating layer 110 being in place, on the top of the first conductivity layer, the formation of the floating gate was completed. In a preferred embodiment, the interlevel insulating layer 110 can be constructed in a single layered structure of an oxide layer or in a multi-layered structure of oxide, nitride and oxide (ONO) layers. A fourth step, shown in FIG. 6D, involves forming a second gate insulating layer 112 on the resultant structure of FIG. 6C above. The second gate insulating layer 112, an oxide layer, is formed by an oxidation process and is to be used as a gate insulating layer for the select transistor. It should be noted, the oxide layer grows more slowly on the interlayer insulating layer than other portions (e.g., the exposed portion of the surface of the substrate, or both sides of the first conductivity layer 108). So the growth of the oxide layer on the interlayer insulating layer 110 is not shown in the drawing for convenience. However, it is to be understood that a process may be included herein to remove portion of the second gate insulating layer, which covers the interlayer insulating layer 110.

Figure 6E:
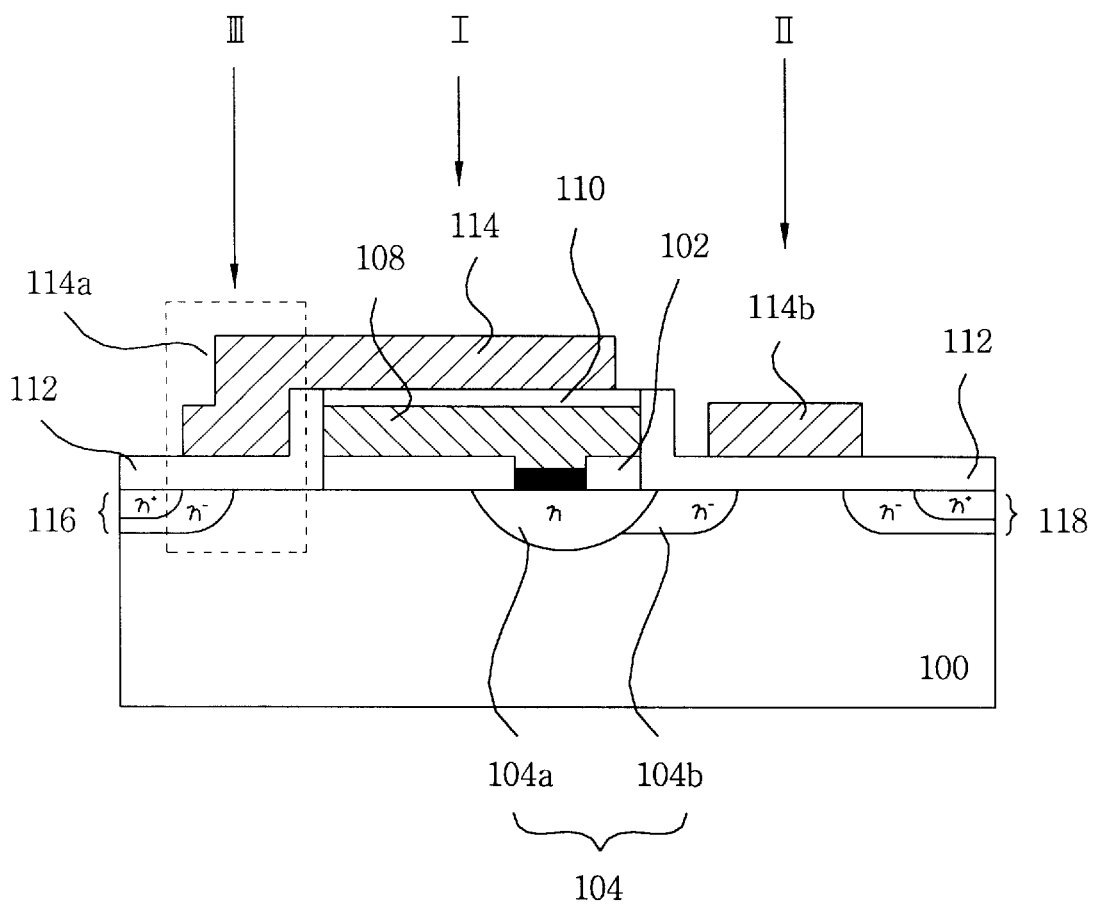

FIG. 6E shows a fifth step according to a preferred embodiment of the present invention. The second conductivity layer 114, of polysilicon or polysilicide, is formed on the second gate insulating layer 112 including the interlevel insulating layer 110. The second conductivity layer 114 is selectively etched to expose a predetermined portion of the surface of the second gate insulating layer 112. Because of the etching process, the second conductivity layer is separated into two parts (114a and 114b). The second conductivity layer 114b is used for the select gate and is located to one side of the first conductivity layer 108 which is used for the floating gate of the sense transistor I. As a further result of the etching process, an integral part of the second conductivity layer 114a is formed along the upper surface of the interlevel insulating layer 110 and a predetermined portion of the second gate insulating layer 112. The second conductivity layer 114a is positioned at the other side of the first conductivity layer 108 and is to be used as control gate and overwriting gate. Accordingly, portions indicated by reference numerals 114 and 114a are used as the control gate for the sense transistor I and the overwriting gate for the overwriting transistor III, respectively.

Then, a n-type (n−) impurity of low density and a n-type (n+) impurity of high density are selectively ion-implanted in sequence to the exposed surface of the second gate insulating layer 112. As a result a n-type second junction 104b, of high density, is formed at the inner portion of the substrate 100 adjacent to the first junction 104a and is overlapped by the second conductivity layer 114b, the select gate, at a predetermined dimension. Also, as a result, a source 116, of the n−/n+ double junction structure, is formed at the inner portion of the substrate 100 and is at a predetermined distance from the first junction 104a. The source is overlapped by the second conductivity layer 114a, the overwriting gate. Still further a drain 118, of the n−/n+ double junction structure, is formed at the inner portion of the substrate 100 and is at a predetermined distance from the second junction 104b. The drain 118 is overlapped by the second conductivity layer 114b, the select gate. Accordingly, the processes of fabricating the EEPROM memory cell is complete.

In conclusion, a sense transistor I is fabricated at a predetermined position on the substrate 100, with its gate comprising the deposition structure of the first conductivity layer 108, the interlevel insulating layer 110, and the second conductivity layer 114, with the first gate insulating layer 102 and the tunnel oxide layer 106, being positioned therebetween. A select transistor II is fabricated, at a predetermined position from the sense transistor I, with its gate comprising the single layered structure of the second conductivity layer 114b. The second gate insulating layer 112 is positioned between the sense transistor I and the select transistor II. The overwriting transistor III is fabricated, at a predetermined position on the other side of the sense transistor I, with its gate comprising the single layered structure of the second conductivity layer 114a. The second gate insulating layer 112 is positioned between the sense transistor I and the overwriting transistor III.

Figure 7:
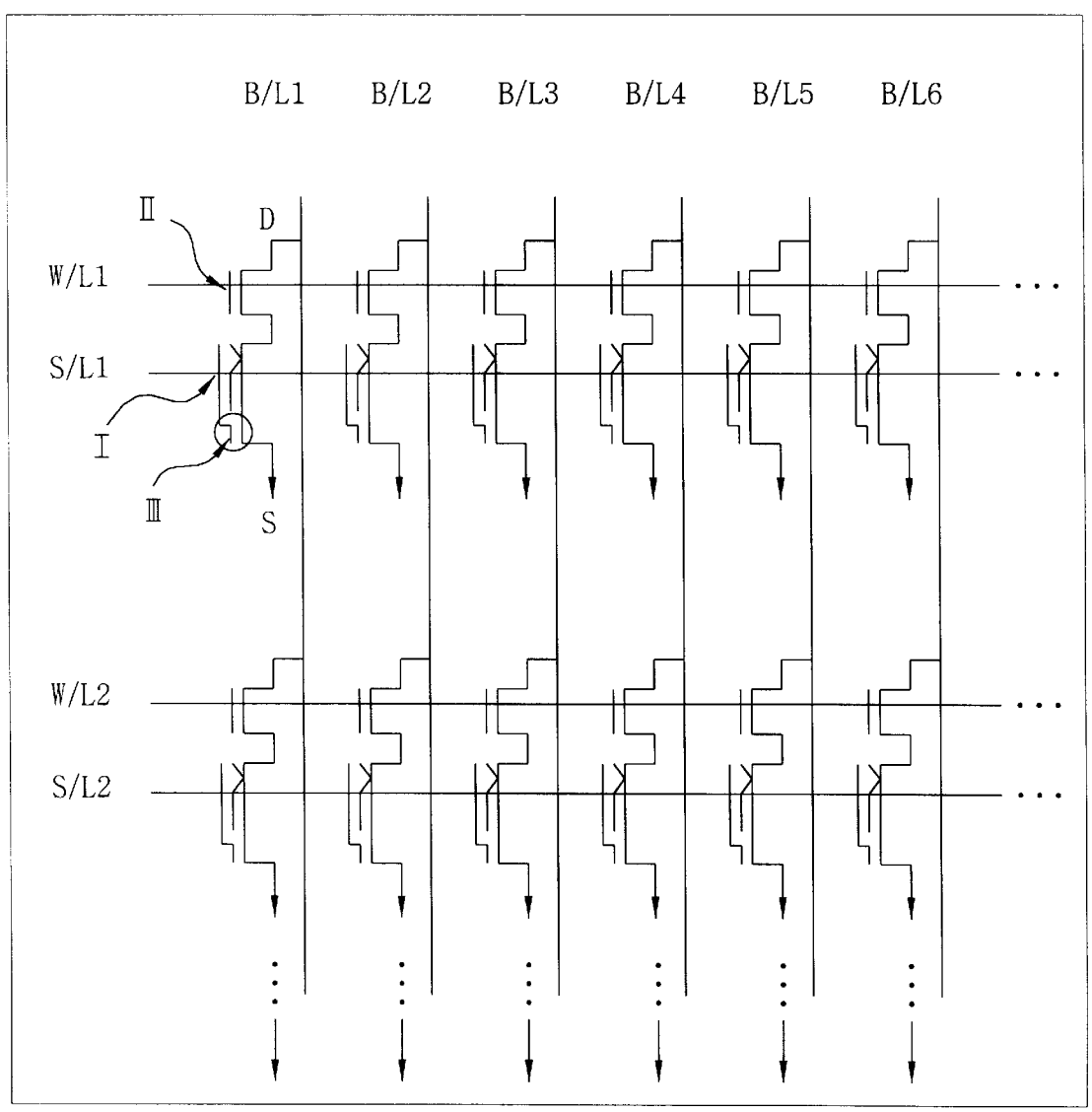
FIG. 7 is a circuit diagram for illustrating the memory cell arrays of the EEPROM device in accordance with an embodiment of the present invention.

FIG. 7 is a circuit diagram for illustrating the memory cell arrays of the EEPROM device whose unit cells have been fabricated according to the structure of FIG. 5. In the circuit, reference symbol S is the source, which is being used as a ground line. The reference symbol D is the drain, which is connected with the bit line. Reference symbols W/L (W/L1, W/L2 . . . ), S/L (S/L1, S/L2 . . . ) and B/L (B/L1, B/L2 . . . ) indicate the select gate, being used as the word line, the control gate being used as the sense line connected with the bit line, and the bit line, respectively.

Again referring to FIG. 7, the overwriting transistors III are formed between the sense transistors I and sources. The overwriting transistors III are used for electrically separating the bit line of the selected cell to be newly programmed and the source of the previously programmed cell thereby preventing an electrical path from forming through the sources of the previously programmed cell and of the selected cell to be programmed in the overwriting process. As a result, when a high voltage is applied to the bit line of the selected cell, it can be used for discharging the electrons from the floating gate. Therefore, the overwriting process can be performed without any programming failure.

As described above, there is an advantage in the present invention of a non-volatile memory cell of the EEPROM device, in that an additional overwriting transistor is fabricated to separate the sense transistor from its source. This prevents an electric path from being formed through sources of the previously programmed cell and the selected cell to be programmed. As a result the overwriting process is free from having any programming failure.

Although the invention has been illustrated and described with respect to exemplary embodiments thereof, it should be understood by those skilled in the art that various other changes, omissions and additions may be made therein and thereto, without departing from the spirit and scope of the present invention.

Therefore, the present invention should not be understood as limited to the specific embodiment set forth above but to include all possible embodiments which can be embodied within a scope encompassed and equivalents thereof with respect to the features set forth in the appended claims.

What is claimed is:

1. A non-volatile memory device comprising:
    a junction formed at a predetermined position inside a substrate of the memory device;
    a source formed inside the substrate and positioned at a predetermined distance from a side of the junction;
    a drain formed inside the substrate and positioned at a predetermined distance from another side of the junction;
    a sense transistor having a gate formed in a deposition structure and being located at a predetermined position on the substrate to partially overlap with the junction, the deposition structure having a first conductivity layer, an interlevel insulating interlayer and a second conductivity layer, the sense transistor including a first gate insulating layer formed with a tunnel oxide layer between the source and the drain;
    a select transistor having a gate formed in a single layered structure of a second conductivity layer and positioned at a predetermined distance from the sense transistor, the select transistor including a second gate insulating layer formed between the junction and the drain on the substrate; and
    an overwriting transistor having a gate formed in a single layered structure of a second conductivity layer and being integrally connected with the second conductivity layer of the sense transistor, the overwriting transistor including a second gate insulating layer formed between the source and the sense transistor.

2. The device as claimed in claim 1, wherein the interlevel insulating layer is constructed in a singe layered structure of an oxide layer.

3. The device as claimed in claim 1, wherein the second conductivity layer is made from polysilicon.

4. The device as claimed in claim 1, wherein the source and drain are formed in a double junction structure.

5. The device as claimed in claim 1, wherein the interlevel insulating layer is constructed as a multi-layered structure of ONO (oxide/nitride/oxide) layers.

6. The device as claimed in claim 1, wherein the second conductivity layer is made from polycide.

7. A method for fabricating a non-volatile memory device comprising the steps of:
    forming a junction at a predetermined position inside a substrate of the memory device;
    forming a source inside the substrate, the source being positioned at a predetermined distance from one side of the junction;
    forming a drain inside the substrate, the drain being positioned at a predetermined distance from the other side of the junction;
    fabricating a sense transistor having a gate formed in a deposition structure and being located at a predetermined position on the substrate to partially overlap with the junction, the deposition structure including a first conductivity layer, an interlevel insulating interlayer and a second conductivity layer, the sense transistor including a first gate insulating layer formed with a tunnel oxide layer between the source and the drain;
    fabricating a select transistor having a gate formed in a single layered structure of a second conductivity layer and positioned at a predetermined distance from the sense transistor, the select transistor including a second gate insulating layer formed between the junction and the drain on the substrate; and
    fabricating an overwriting transistor having a gate formed in a single layered structure of a second conductivity layer and being integrally connected with the second conductivity layer of the sense transistor, the overwriting transistor including a second gate insulating layer formed between the source and the sense transistor.

8. The method as claimed in claim 7, wherein the interlevel insulating layer is formed in a singe layered structure of an oxide layer.

9. The method as claimed in claim 7, wherein the second conductivity layer is made of polysilicon.

10. The method as claimed in claim 7, wherein the source and drain are formed in a double junction structure.

11. The method as claimed in claim 7, wherein the interlevel insulating layer is formed as a multi-layered structure of ONO (oxide/nitride/oxide) layers.

12. The method as claimed in claim 7, wherein the second conductivity layer is made from polycide.

* * * * *